US012813189B2

(12) United States Patent
Hayashida et al.

(10) Patent No.: US 12,813,189 B2
(45) Date of Patent: Nov. 24, 2026

(54) SUBSTRATE PROCESSING APPARATUS AND FLUID HEATING DEVICE

(71) Applicant: Tokyo Electron Limited, Tokyo (JP)

(72) Inventors: Takahiro Hayashida, Koshi City (JP); Shigeru Moriyama, Koshi City (JP); Shota Umezaki, Koshi City (JP)

(73) Assignee: Tokyo Electron Limited, Tokyo (JP)

( * ) Notice: Subject to any disclaimer, the term of this patent is extended or adjusted under 35 U.S.C. 154(b) by 481 days.

(21) Appl. No.: 18/489,229

(22) Filed: Oct. 18, 2023

(65) Prior Publication Data

US 2024/0136206 A1 Apr. 25, 2024
US 2024/0234172 A9 Jul. 11, 2024

(30) Foreign Application Priority Data

Oct. 20, 2022 (JP) ................................ 2022-168325

(51) Int. Cl.

| | |
|---|---|
| ***F16L 55/30*** | (2006.01) |
| ***F16L 53/00*** | (2018.01) |
| ***F16L 53/34*** | (2018.01) |
| ***F16L 53/37*** | (2018.01) |
| ***H10P 72/00*** | (2026.01) |
| *F24H 7/04* | (2006.01) |

(52) U.S. Cl.
CPC ............ *H10P 72/0408* (2026.01); *F24H 7/04* (2013.01)

(58) Field of Classification Search
CPC . F16L 55/30; F16L 55/35; F16L 53/00; F16L 53/30; F16L 53/38; F16L 53/34; F16L 53/37; F16L 59/14; F16L 59/18
See application file for complete search history.

(56) References Cited

U.S. PATENT DOCUMENTS

| | | | | |
|---|---|---|---|---|
| 5,704,214 A * | 1/1998 | Fujikawa | ................. | B01D 8/00 62/55.5 |
| 2017/0238365 A1* | 8/2017 | Lilleland | .................. | H05B 3/10 219/535 |
| 2021/0159095 A1* | 5/2021 | Ihara | .................. | H10P 72/0408 |

FOREIGN PATENT DOCUMENTS

| | | | |
|---|---|---|---|
| JP | S57-34249 U | 2/1982 | |
| JP | S59-83890 A | 5/1984 | |
| JP | H06-283492 A | 10/1994 | |
| JP | 2002-206690 A | 7/2002 | |
| JP | 4667606 B2 * | 4/2011 | ............. F16L 59/14 |
| JP | 2013-012538 A | 1/2013 | |
| JP | 2013-016798 A | 1/2013 | |
| JP | 6305655 * | 4/2018 | ............. F16L 53/00 |

(Continued)

OTHER PUBLICATIONS

English copy of JP4667606 by PE2E Mar. 5, 2026.*
English copy of JP6305655 by PE2E Mar. 5, 2026.*

*Primary Examiner* — Deming Wan
(74) *Attorney, Agent, or Firm* — Armstrong Teasdale LLP

(57) ABSTRACT

A substrate processing apparatus that dries a liquid adhering to a substrate by using a processing fluid in a supercritical state, includes: a processing container in which the substrate is accommodated; a plurality of pipes configured to allow the processing fluid to flow to and from the processing container therethrough; a first fluid heating device configured to heat a first pipe that supplies the processing fluid to an interior of the processing container among the plurality of pipes; and a second fluid heating device configured to heat a second pipe that discharges the processing fluid from the interior of the processing container among the plurality of pipes.

17 Claims, 18 Drawing Sheets

(56) References Cited

FOREIGN PATENT DOCUMENTS

| | | | |
|---|---|---|---|
| JP | 2022-043882 | A | 3/2022 |
| WO | 2012077209 | A1 | 6/2012 |
| WO | 2018150518 | A1 | 8/2018 |

* cited by examiner

SUBSTRATE PROCESSING APPARATUS AND FLUID HEATING DEVICE

CROSS-REFERENCE TO RELATED APPLICATION

This application is based upon and claims the benefit of priority from Japanese Patent Application No. 2022-168325, filed on Oct. 20, 2022, the entire contents of which are incorporated herein by reference.

TECHNICAL FIELD

The present disclosure relates to a substrate processing apparatus and a fluid heating device.

BACKGROUND

A technique for drying a substrate by using a processing fluid in a supercritical state is known (see, for example, Patent Documents 1 and 2).

PRIOR ART DOCUMENTS

Patent Documents

Patent Document 1: Japanese Patent Laid-Open Publication No. 2013-012538

Patent Document 2: Japanese Patent Laid-Open Publication No. 2013-016798

SUMMARY

According to one embodiment of the present disclosure, there is provided a substrate processing apparatus that dries a liquid adhering to a substrate by using a processing fluid in a supercritical state, includes: a processing container in which the substrate is accommodated; a plurality of pipes configured to allow the processing fluid to flow to and from the processing container therethrough; a first fluid heating device configured to heat a first pipe that supplies the processing fluid to an interior of the processing container among the plurality of pipes; and a second fluid heating device configured to heat a second pipe that discharges the processing fluid from the interior of the processing container among the plurality of pipes.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
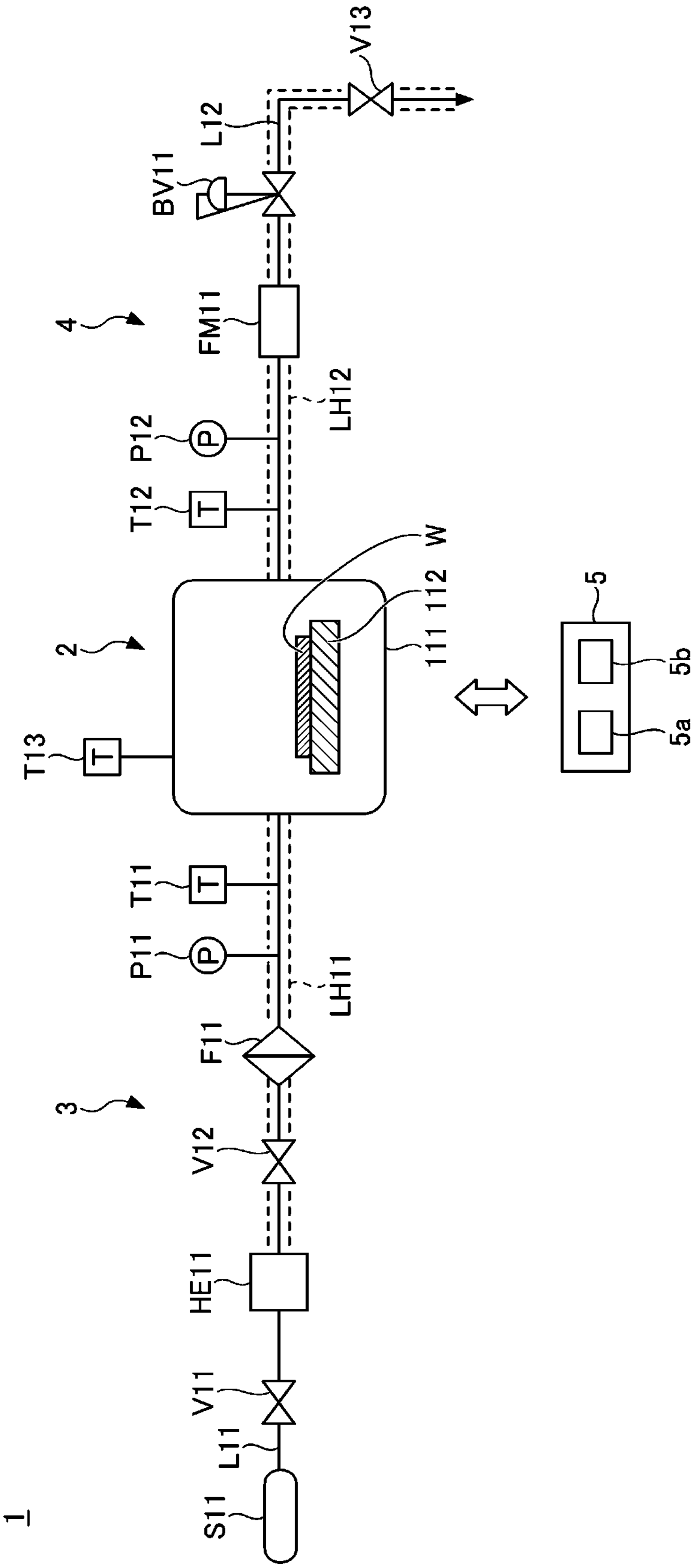
FIG. 1 is a schematic view illustrating a substrate processing apparatus according to an embodiment.

Hereinafter, non-limiting exemplary embodiments of the present disclosure will be described with reference to the accompanying drawings. In all of the accompanying drawings, the same or corresponding members or components will be denoted by the same or corresponding reference numerals, and redundant descriptions thereof will be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

[Substrate Processing Apparatus]

A substrate processing apparatus 1 according to an embodiment will be described with reference to FIG. 1. FIG. 1 is a schematic view illustrating the substrate processing apparatus 1 according to an embodiment.

The substrate processing apparatus 1 is an apparatus that dries liquid adhering to the substrate W using a processing fluid in a supercritical state. The substrate processing apparatus 1 includes a processor 2, a fluid supply system 3, a discharger 4, and a controller 5.

The processor 2 includes a processing container 111 and a holding plate 112. The processing container 111 is a container in which a processing space capable of accommodating, for example, the substrate W having a diameter of 300 mm, is formed. The substrate W may be, for example, a semiconductor wafer. The holding plate 112 is provided inside the processing container 111. The holding plate 112 holds the substrate W horizontally. The processor 2 may include a pressure sensor that detects an internal pressure of the processing container 111 and a temperature sensor that detects an internal temperature of the processing container 111. In the example of FIG. 1, the processor 2 includes a temperature sensor T13. Details of the processor 2 will be described later.

The fluid supply system 3 includes a supply channel L11. The supply channel L11 is connected to the processing container 111. The supply channel L11 supplies fluid into the processing container 111. A fluid source S11, an opening/closing valve V11, a heating mechanism HE11, an opening/closing valve V12, a filter F11, a pressure sensor P11, and a temperature sensor T11 are provided in the supply channel L11 in that order from upstream. A line heater LH11 is provided downstream of the heating mechanism HE11 in the supply channel L11. An orifice, an opening/closing valve, a temperature sensor, a pressure sensor, and the like (not illustrated) may be further provided in the supply channel L11.

The fluid source S11 includes a source of a fluid. The fluid includes, for example, a processing fluid and an inert gas. The processing fluid may be, for example, carbon dioxide ($CO_2$). The inert gas may be, for example, a nitrogen ($N_2$) gas.

The opening/closing valve V11 is a valve that switches on and off the fluid flow. The opening/closing valve V11 allows the fluid to flow to the downstream heating mechanism HE11 in the open state, and does not allow the fluid to flow to the downstream heating mechanism HE11 in the closed state.

The heating mechanism HE11 heats the fluid to a set temperature and supplies the fluid at the set temperature downstream. The set temperature may be, for example, 100 degrees C. or higher and 120 degrees C. or lower.

The opening/closing valve V12 is a valve that switches on and off the fluid flow. The opening/closing valve V12 allows the fluid to flow to the downstream filter F11 in the open state, and does not allow the fluid to flow to the downstream filter F11 in the closed state.

The filter F11 filters the fluid flowing through the supply channel L11 and removes foreign substances contained in the fluid. This makes it possible to suppress the generation of particles on a front surface of the substrate W during substrate processing using the fluid.

The pressure sensor P11 detects a pressure of the fluid flowing through the supply channel L11. The pressure sensor P11 is provided, for example, immediately in front of the processing container 111.

The temperature sensor T11 detects a temperature of the fluid flowing through the supply channel L11. The temperature sensor T11 is provided, for example, immediately in front of the processing container 111.

The line heater LH11 heats the supply channel L11 downstream of the heating mechanism RE11. The line heater LH11 suppresses temperature drop when the fluid heated to the set temperature by the heating mechanism HE11 flows through the supply channel L11. The line heater LH11 is provided to supply the fluid heated to the set temperature by the heating mechanism HE11 into the processing container 111 in an environment having the same temperature as the set temperature. The line heater LH11 is an example of a fluid heating device and a first fluid heating device. Details of the line heater LH11 will be described later.

The discharger 4 includes a discharge channel L12. The discharge channel L12 is connected to the processing container 111. The discharge channel L12 discharges the fluid from the interior of the processing container 111. A temperature sensor T12, a pressure sensor P12, a flow meter FM11, a back pressure valve BV11, and an opening/closing valve V13 are provided in the discharge channel L12 in that order from upstream. A line heater LH12 is provided in the discharge channel L12. An opening/closing valve, a temperature sensor, a pressure sensor, and the like (all not illustrated) may be further provided in the discharge channel L12.

The temperature sensor T12 detects a temperature of the fluid flowing through the discharge channel L12. The temperature sensor T12 is provided, for example, immediately behind the processing container 111.

The pressure sensor P12 detects a pressure of the fluid flowing through the discharge channel L12. The pressure sensor P12 is provided, for example, immediately behind the processing container 111. As a result, the internal pressure of the processing container 111 may be detected.

The flow meter FM11 detects a flow rate of the fluid flowing through the discharge channel L12.

When a primary-side pressure of the discharge channel L12 exceeds the set pressure, the back pressure valve BV11 maintains the primary-side pressure at the set pressure by adjusting a degree of opening thereof and allowing the fluid to flow to a secondary side. For example, the set pressure of the back pressure valve BV11 is adjusted by the controller 5 based on an output of the flow meter FM11.

The opening/closing valve V13 is a valve that switches on and off the fluid flow. The opening/closing valve V13 allows the fluid to flow to the downstream discharge channel L12 in the open state, and does not allow the fluid to flow to the downstream discharge channel L12 in the closed state.

The line heater LH12 heats the discharge channel L12. The line heater LH12 suppresses temperature drop when the fluid discharged from the interior of the processing container 111 flows through the discharge channel L12. As a result, it is possible to suppress the deposition of particles due to a phase change of the fluid flowing through the discharge channel L12. The line heater LH12 is an example of a fluid heating device and a second fluid heating device. Details of the line heater LH12 will be described later.

The controller 5 receives measurement signals from various sensors and transmits control signals to various functional elements. The measurement signals include, for example, detection signals from the temperature sensors T11, T12, and T13, detection signals from the pressure sensors P11 and P12, and detection signals from the flow meter FM11. The control signals include, for example, opening/closing signals for opening/closing valves V11, V12, and V13, a set pressure signal for back pressure valve BV11, and temperature signals for line heaters LH11 and LH12.

The controller 5 is, for example, a computer, and includes a calculator 5*a* and a storage 5*b*. Programs for controlling various processes executed in the substrate processing apparatus 1 are stored in the storage 5*b*. The calculator 5*a* controls the operation of the substrate processing apparatus 1 by reading and executing a program stored in the storage 5*b*. The program may be recorded in a non-transitory computer-readable storage medium and installed in the storage 5*b* of the controller 5 from the storage medium. The computer-readable storage medium is, for example, a hard disk (HD), a flexible disk (FD), a compact disk (CD), a magneto-optical disk (MO), a memory card, or the like.

The substrate processing apparatus 1 according to an embodiment includes the line heater LH11 that heats the supply channel L11 and the line heater LH12 that heats the discharge channel L12. The line heater LH11 suppresses the temperature drop when the fluid heated to the set temperature by the heating mechanism HE11 flows through the supply channel L11. The line heater LH12 suppresses the temperature drop when the fluid discharged from the interior of the processing container 111 flows through the discharge channel L12. Therefore, it is possible to reduce a temperature fluctuation of a fluid.

[Line Heater]

Configuration examples of the line heaters LH11 and LH12 will be described.

First Example

Figure 2:
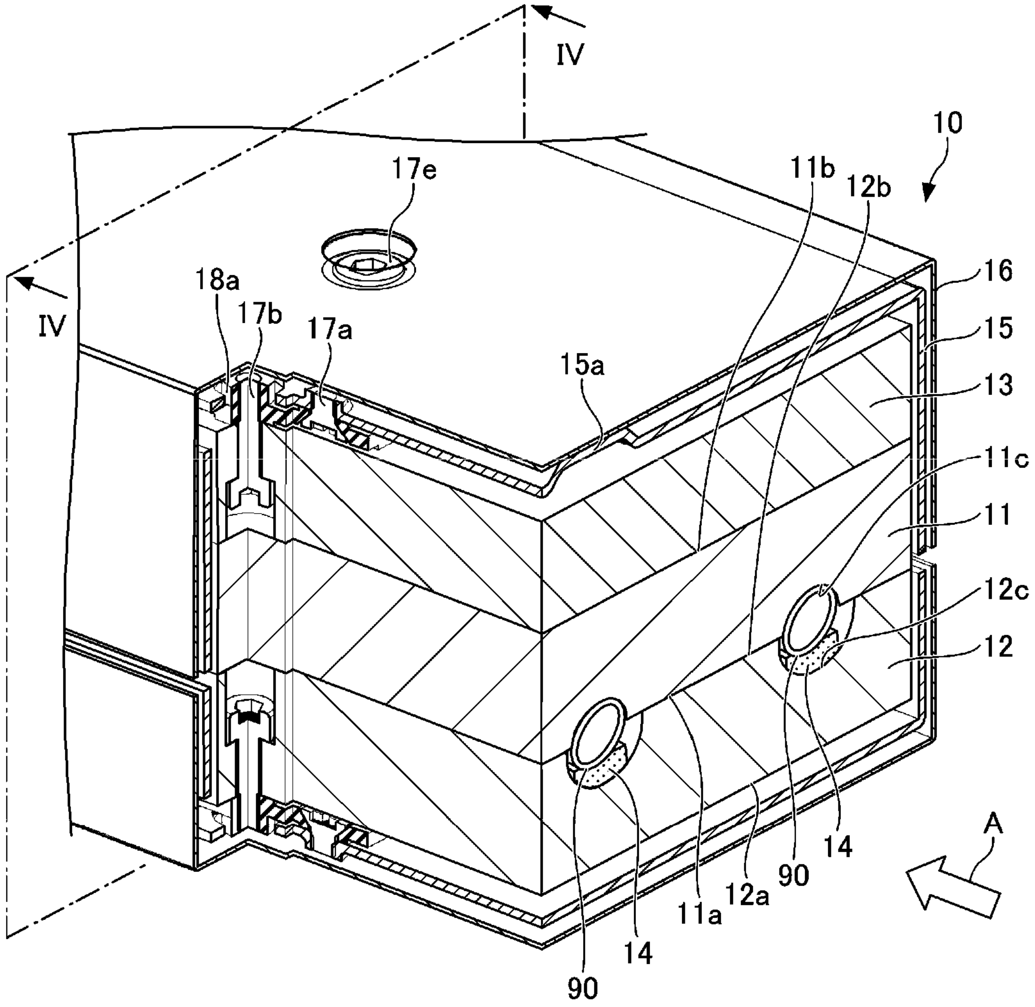
FIG. 2 is a perspective cross-sectional view illustrating a line heater according to a first example of the embodiment.
Figure 3:
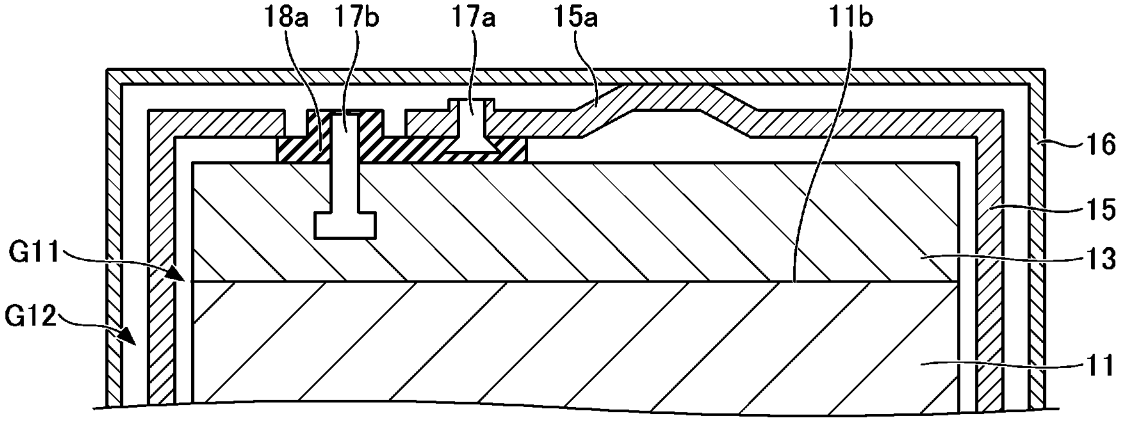
FIG. 3 is a view of the line heater of FIG. 2 viewed from a direction of arrow A.
Figure 4:
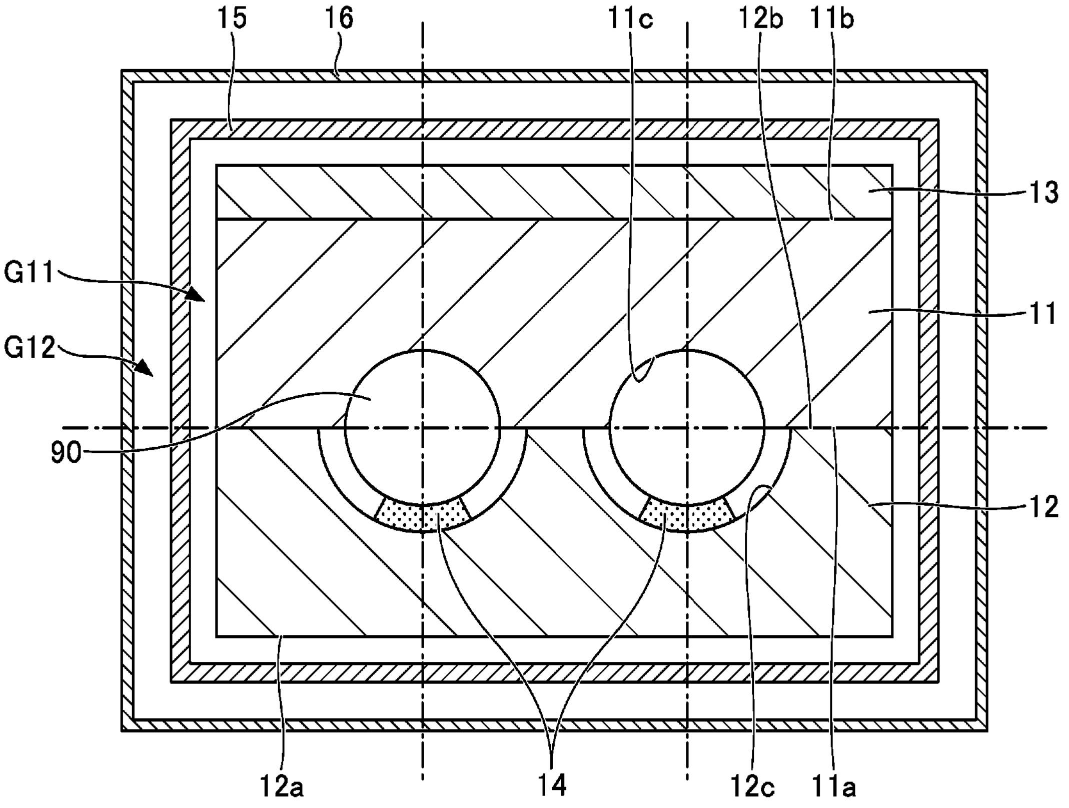
FIG. 4 is a view corresponding to a cross section taken along line IV-IV in FIG. 2.

A line heater 10 according to a first example of the embodiment will be described with reference to FIGS. 2 to 4. FIG. 2 is a perspective cross-sectional view illustrating the line heater 10 according to the first example of the embodiment. FIG. 3 is a view of the line heater 10 of FIG. 2 viewed from a direction of arrow A. FIG. 4 is a view corresponding to a cross section taken along line IV-IV in FIG. 2.

The line heater 10 is provided, for example, in a portion where a plurality of (e.g., two) pipes 90 forming the supply channel L11 are arranged in parallel with each other. The line heater 10 may be provided in a portion where two pipes 90 forming the discharge channel L12 are arranged in parallel with each other. The line heater 10 includes a heat transfer member 11, a heat insulating member 12, a heater 13, a flexible member 14, an inner housing 15, and an outer housing 16. The line heater 10 may include a temperature measurer 19 which will be described later.

The heat transfer member 11 extends along central axis directions of the pipes 90. The heat transfer member 11 has a block shape with a rectangular cross section orthogonal to the central axis directions of the pipes 90. The heat transfer member 11 includes a first surface 11*a* and a second surface 11*b*. The first surface 11*a* has a planar shape. The first surface 11*a* is in contact with the heat insulating member 12. Grooves 11*c* are provided in the first surface 11*a*. The grooves 11*c* extend along the central axis direction of the pipes 90. The inner surfaces of the grooves 11*c* have, for example, curved shapes along outer wall surfaces of the pipes 90, respectively. The second surface 11*b* is a surface opposite to the first surface 11*a*. The second surface 11*b* has a planar shape. The second surface 11*b* is in contact with the heater 13.

The heat insulating member 12 extends along the central axis direction of the pipes 90. The heat insulating member 12 has a block shape with a rectangular cross section orthogonal to the central axis direction of the pipes 90. The heat insulating member 12 is provided facing the heat transfer member 11 such that the two pipes 90 are sandwiched between the heat insulating member 12 and the heat transfer member 11. In the cross section orthogonal to the central axis direction of the pipes 90, a straight line passing through the center of one pipe 90 and the center of the other pipe 90 may be parallel to the surfaces where the heat transfer member 11 and the heater 13 are in contact with each other. In this case, a distance from the heater 13 to one pipe 90 and a distance from the heater 13 to the other pipe 90 are equal to each other. Therefore, the two pipes 90 can be evenly heated.

The heat insulating member 12 includes a first surface 12*a* and a second surface 12*b*. The first surface 12*a* has a planar shape. The second surface 12*b* is a surface opposite to the first surface 12*a*. The second surface 12*b* has a planar shape. The second surface 12*b* is in contact with the heat transfer member 11. Grooves 12*c* are provided in the second surface 12*b*. The grooves 12*c* extend along the central axis direction of the pipes 90. Inner surfaces of the grooves 12*c* have, for example, curved shapes along the outer wall surfaces of the pipes 90, respectively. The pipes 90 are accommodated in spaces defined by the grooves 11*c* and 12*c* in a state in which the first surface 11*a* of the heat transfer member 11 and the second surface 12*b* of the heat insulating member 12 are in contact with each other.

The heat transfer member 11 and the heat insulating member 12 are made of a metal such as aluminum, stainless steel, copper, or iron. In this case, the heat transfer member 11 has rigidity to be capable of pressing the pipes 90 stably. Moreover, since the heat transfer member 11 and the heat insulating member 12 may be connected to each other by using screws, assembly is simplified. Therefore, variations in individual products may be reduced. The heat transfer member 11 and the heat insulating member 12 may be made of the same material or may be made of different materials.

The heater 13 extends along the central axis direction of the pipes 90. The heater 13 has a block shape with a rectangular cross section orthogonal to the central axis direction of the pipes 90. The heater 13 is in contact with the second surface 11*b* of the heat transfer member 11. The heater 13 heats the pipes 90 via the heat transfer member 11. The heater 13 is, for example, a block body in which a heating element is embedded. The heater 13 is fixed to the inner housing 15 with screws 17*a* and 17*b* and a resin member 18*a*. Specifically, the resin member 18*a* is fixed to the inner housing 15 by the screw 17*a*, and the heater 13 is fixed to the resin member 18*a* by the screw 17*b*.

The flexible members 14 are provided between the pipes 90 and the heat insulating member 12. The flexible members 14 are provided on the inner surface of the groove 12*c*. The flexible member 14 presses the pipes 90 against the heat transfer member 11 in a state in which the heat transfer member 11 and the heat insulating member 12 are in contact with each other with the pipes 90 interposed therebetween. In this case, the adhesion between the heat transfer member 11 and the pipes 90 is improved. Therefore, thermal resistance generated in the contact surfaces between the heat transfer member 11 and the pipes 90 may be reduced. The flexible members 14 are made of a flexible material such as a polytetrafluoroethylene (PTFE) sheet.

The inner housing 15 extends along the central axis direction of the pipes 90. The inner housing 15 covers the heat transfer member 11, the heat insulating member 12, and the heater 13. The inner housing 15 is provided outside the heat transfer member 11, the heat insulating member 12, and the heater 13 with a gap G11 with respect to the heat transfer member 11, the heat insulating member 12, and the heater 13. In this case, an air layer is formed by the gap G11, so that heat insulation is enhanced. The inner housing 15 is made of a hard material such as stainless steel. In this case, differences in heat dissipation area among a plurality of line heaters 10 may be reduced compared to a case where the inner housings are made of a soft material. The inner housing 15 may have a polished inner surface and a polished outer surface. In this case, radiation heat exchange may be suppressed. The inner housing 15 may have a convex portion 15*a* protruding toward the outer housing 16. The convex portion 15*a* is in contact with the inner surface of the outer housing 16. The convex portion 15*a* is, for example, spot-welded to the outer housing 16.

The outer housing 16 extends along the central axis direction of the pipes 90. The outer housing 16 covers the inner housing 15. The outer housing 16 is provided outside the inner housing 15 with a gap G12 with respect to the inner housing 15. In this case, an air layer is formed by the gap G12, and heat insulation is enhanced. The gap G12 may be maintained in a vacuum enhancing the heat insulation. A heat insulating material may be provided in the gap G12 further enhancing the heat insulation. The outer housing 16 is made of a hard material such as stainless steel. In this case, the differences in heat dissipation area among the plurality of line heaters 10 may be reduced compared to the case where the inner housings are made of a soft material. The outer housing 16 may have a polished inner surface. In this case, radiation heat exchange may be suppressed.

Figure 5:
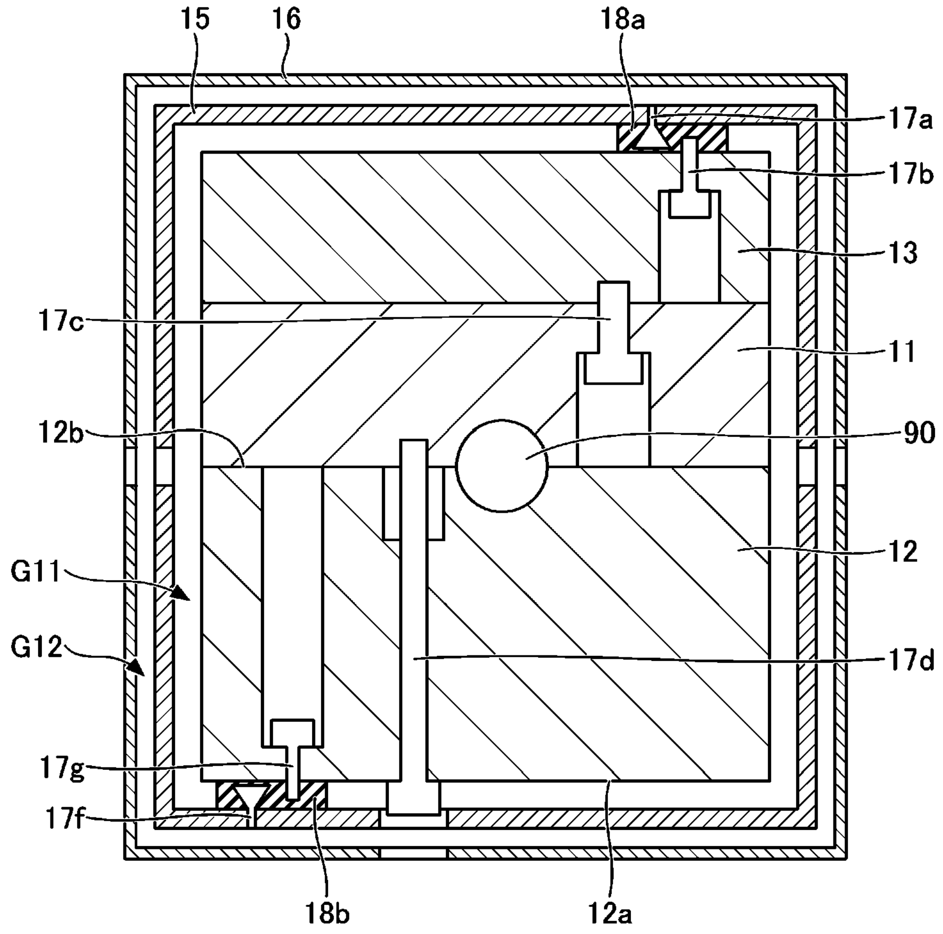
FIG. 5 is a view illustrating a method of fixing each member.
Figure 6:
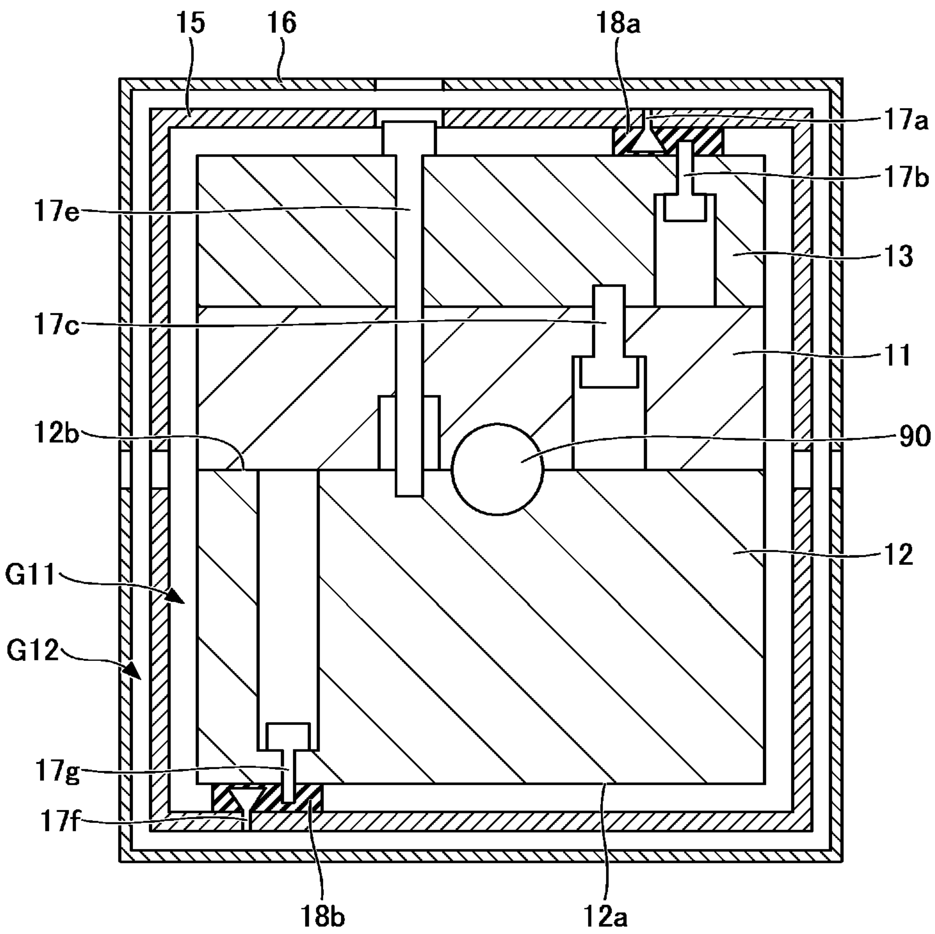
FIG. 6 is a view illustrating a method of fixing each member.

A method of fixing each member will be described with reference to FIGS. 5 and 6. FIG. 5 is a view illustrating an example of the method of fixing each member. FIG. 6 is a view illustrating another example of the method of fixing each member. FIGS. 5 and 6 illustrate a case where one pipe 90 is sandwiched between the heat transfer member 11 and the heat insulating member 12, but the same may be the case where a plurality of pipes 90 are sandwiched between the heat transfer member 11 and the heat insulating member 12.

The heat transfer member 11 is fixed to the heater 13 with a screws 17*c*, as illustrated in FIGS. 5 and 6.

As illustrated in FIG. 5, the heat insulating member 12 is fixed to the heat transfer member 11 by a screw 17*d* that penetrates the heat insulating member 12 from the first surface 12*a* side. As illustrated in FIG. 6, the heat insulating member 12 may be fixed to the heat transfer member 11 by a screw 17*e* that penetrates the heater 13 and the heat transfer member 11 from the second surface 12*b* side. As illustrated in FIGS. 5 and 6, the heat insulating member 12 is fixed to the inner housing 15 with screws 17*f* and 17*g* and a resin member 18*b*. Specifically, the resin member 18*b* is fixed to the inner housing 15 by a screw 17*f*, and the heat insulating member 12 is fixed to the resin member 18*b* by the screw 17*g*. The resin member 18*b* is made of, for example, polyetheretherketone (PEEK).

As illustrated in FIGS. 5 and 6, the heater 13 is fixed to the inner housing 15 with the screws 17*a* and 17*b* and the resin member 18*a*. Specifically, the resin member 18*a* is fixed to the inner housing 15 by the screw 17*a*, and the heater 13 is fixed to the resin member 18*a* by the screw 17*b*.

Second Example

Figure 7:
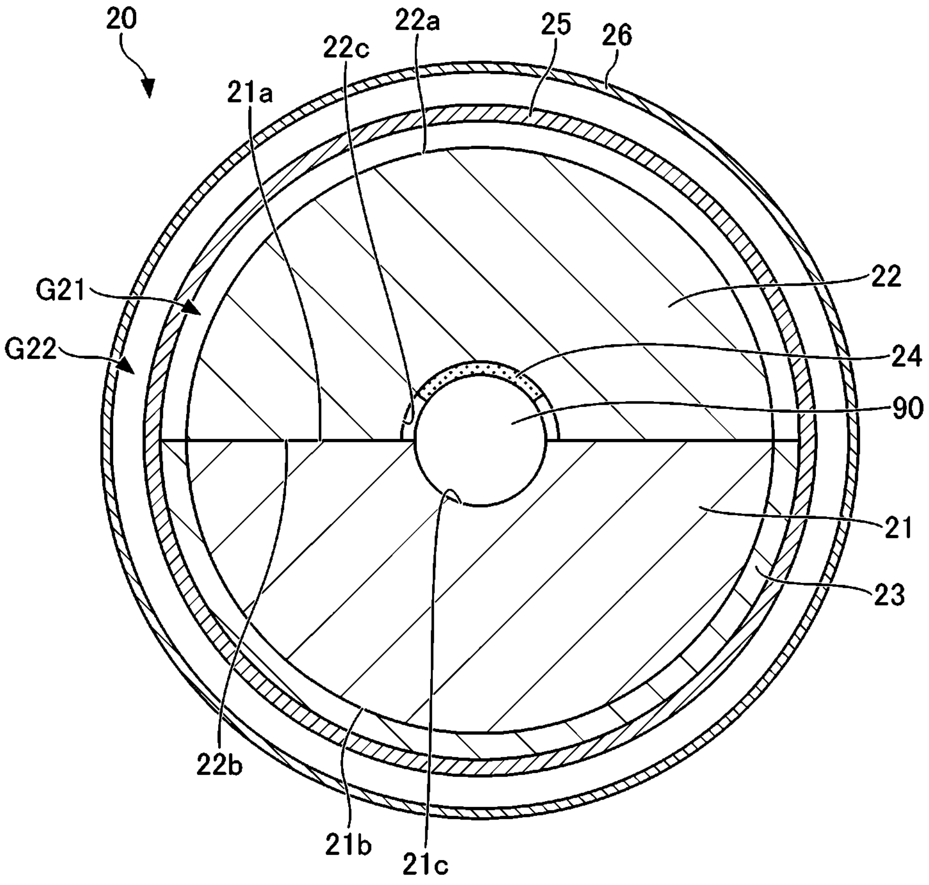
FIG. 7 is a cross-sectional view illustrating a line heater according to a second example of the embodiment.

A line heater 20 according to a second example of the embodiment will be described with reference to FIG. 7. FIG. 7 is a cross-sectional view illustrating the line heater 20 according to the second example of the embodiment. FIG. 7 is a view illustrating a cross section orthogonal to the central axis direction of a pipe 90.

The line heater 20 is provided, for example, in a portion where one pipe 90 forming the supply channel L11 is arranged. The line heater 20 may be provided in a portion where one pipe 90 forming the discharge channel L12 is arranged. The line heater 20 includes a heat transfer member 21, a heat insulating member 22, a heater 23, a flexible member 24, an inner housing 25, and an outer housing 26.

The heat transfer member 21 extends along the central axis directions of the pipe 90. The heat transfer member 21 has a block shape with a semicircular cross section orthogonal to the central axis direction of the pipe 90. The heat transfer member 21 includes a first surface 21*a* and a second surface 21*b*. The first surface 21*a* has a planar shape. The first surface 21*a* is in contact with the heat insulating member 22. A groove 21*c* is provided in the first surface 21*a*. The groove 21*c* extends along the central axis direction of the pipe 90. The inner surface of the groove 21*c* has, for example, a curved shape along the outer wall surface of the pipe 90. The second surface 21*b* is a surface opposite to the first surface 21*a*. The second surface 21*b* has a curved shape. The second surface 21*b* is in contact with the heater 23. The heat transfer member 21 is made of, for example, the same material as the heat transfer member 11. The heat transfer member 21 is fixed, for example, in the same manner as the heat transfer member 11.

The heat insulating member 22 extends along the central axis direction of the pipe 90. The heat insulating member 22 has a block shape with a semicircular cross section orthogonal to the central axis direction of the pipe 90. The heat insulating member 22 is provided to face the heat transfer member 21 such that the one pipe 90 is sandwiched between the heat insulating member 22 and the heat transfer member 21. The heat insulating member 22 includes a first surface 22*a* and a second surface 22*b*. The first surface 22*a* has a curved shape. The second surface 22*b* is a surface opposite to the first surface 22*a*. The second surface 22*b* has a planar shape. The second surface 22*b* is in contact with the heat transfer member 21. A groove 22*c* is provided in the second surface 22*b*. The groove 22*c* extends along the central axis direction of the pipe 90. The inner surface of the groove 22*c* has, for example, a curved shape along the outer wall surface of the pipe 90. The pipe 90 is accommodated in the space defined by the grooves 21*c* and 22*c* in a state in which the first surface 21*a* of the heat transfer member 21 and the second surface 22*b* of the heat insulating member 22 are in contact with each other. The heat insulating member 22 is made of, for example, the same material as the heat insulating member 12. The heat insulating member 22 is fixed, for example, in the same manner as the heat insulating member 12.

The heater 23 extends along the central axis direction of the pipe 90. The heater 23 has a semicircular cross section orthogonal to the central axis of the pipe 90. The heater 23 is in contact with the second surface 21*b* of the heat transfer member 21. The heater 23 covers the entire second surface 21*b* of the heat transfer member 21. The heater 23 heats the pipe 90 through the heat transfer member 21. The heater 23 is, for example, a block body in which a heating element is embedded. The heater 23 is fixed, for example, in the same manner as the heater 13.

The flexible member 24 is provided between the pipe 90 and the heat insulating member 22. The flexible members 24 are provided on the inner surface of the groove 22*c*. The flexible member 24 presses the pipe 90 against the heat transfer member 21 in a state in which the heat transfer member 21 and the heat insulating member 22 are in contact with each other with the pipe 90 interposed therebetween. In this case, the adhesion between the heat transfer member 21 and the pipe 90 is improved. Therefore, thermal resistance generated in the contact surfaces between the heat transfer member 21 and the pipe 90 may be reduced. The flexible member 24 is made of, for example, the same material as the flexible member 14.

The inner housing 25 extends along the central axis direction of the pipe 90. The inner housing 25 has, for example, a cylindrical shape. The inner housing 25 covers the heat transfer member 21, the heat insulating member 22, and the heater 23. The inner housing 25 is provided outside the heat transfer member 21, the heat insulating member 22, and the heater 23 with a gap G21 with respect to the heat transfer member 21, the heat insulating member 22, and the heater 23. In this case, an air layer is formed by the gap G21, so that heat insulation is enhanced. The inner housing 25 is made of, for example, the same material as the inner housing 15.

The outer housing 26 extends along the central axis direction of the pipe 90. The outer housing 26 has, for example, a cylindrical shape. The outer housing 26 covers the inner housing 25. The outer housing 26 is provided outside the inner housing 25 with a gap G22 with respect to the inner housing 25. In this case, an air layer is formed by the gap G22, so that heat insulation is enhanced. The gap G22 may be maintained in a vacuum. In this case, the heat insulation is further enhanced. A heat insulating material may be provided in the gap G22. In this case, the heat insulation is further enhanced. The outer housing 26 is made of, for example, the same material as the outer housing 16.

Third Example

Figure 8:
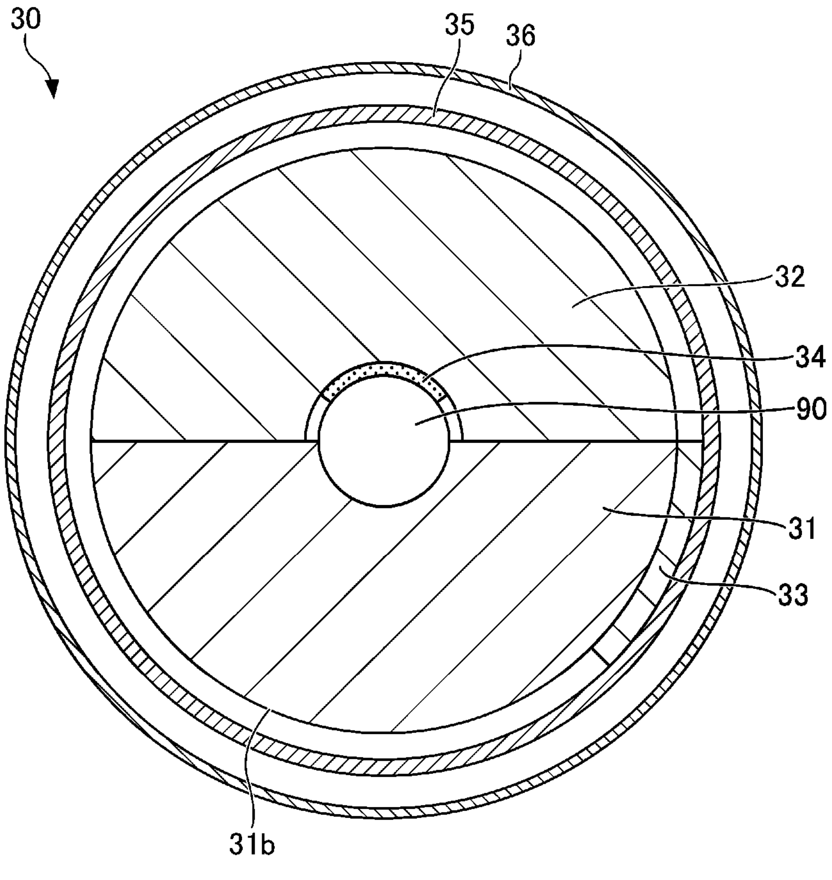
FIG. 8 is a cross-sectional view illustrating a line heater according to a third example of the embodiment.

A line heater 30 according to a third example of the embodiment will be described with reference to FIG. 8. FIG. 8 is a cross-sectional view illustrating the line heater 30 according to the third example of the embodiment. FIG. 8 is a view illustrating a cross section orthogonal to the central axis direction of a pipe 90.

The line heater 30 includes a heat transfer member 31, a heat insulating member 32, a heater 33, a flexible member 34, an inner housing 35, and an outer housing 36.

The line heater 30 differs from the line heater 20 in that the heater 33 is provided on a portion of the second surface 31*b* of the heat transfer member 31 and covers a portion of the heat transfer member 31. The heat transfer member 31, the heat insulating member 32, the flexible member 34, the inner housing 35, and the outer housing 36 may be the same as the heat transfer member 21, the heat insulating member 22, the flexible member 24, the inner housing 25, and the outer housing 26, respectively.

Fourth Example

Figure 9:
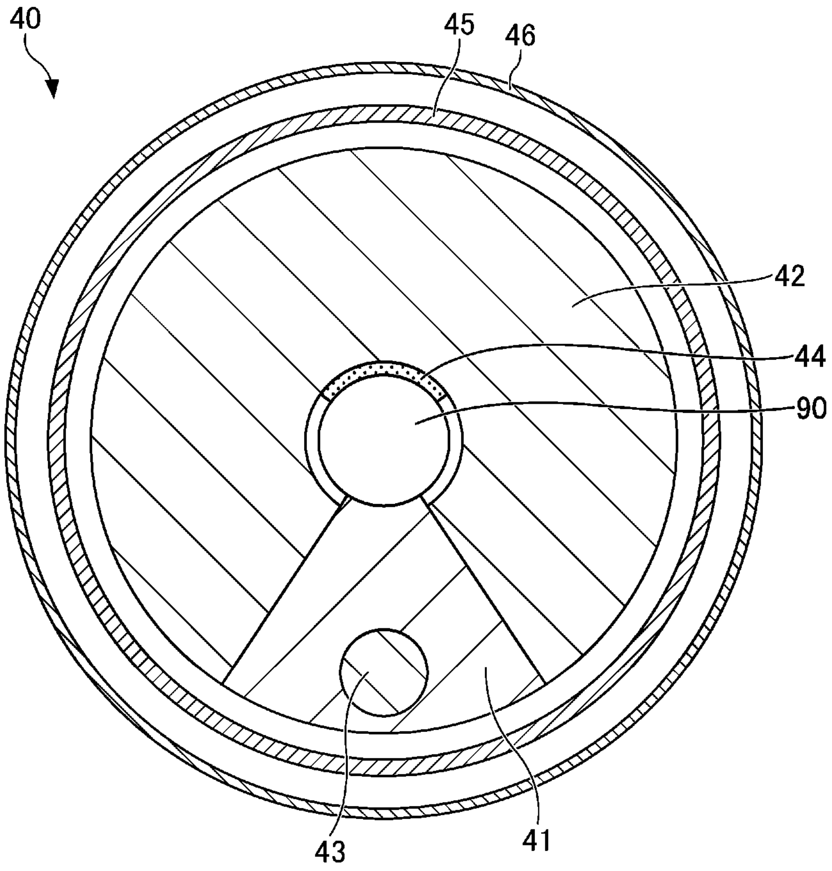
FIG. 9 is a cross-sectional view illustrating a line heater according to a fourth example of the embodiment.

A line heater 40 according to a fourth example of the embodiment will be described with reference to FIG. 9. FIG. 9 is a cross-sectional view illustrating the line heater 40 according to the fourth example of the embodiment. FIG. 9 is a view illustrating a cross section orthogonal to the central axis direction of a pipe 90.

The line heater 40 includes a heat transfer member 41, a heat insulating member 42, a heater 43, a flexible member 44, an inner housing 45, and an outer housing 46.

The line heater 40 differs from the line heater 20 in that the heater 43 is embedded in the heat transfer member 41 and is in contact with the heat transfer member 41. The heat transfer member 41, the heat insulating member 42, the flexible member 44, the inner housing 45, and the outer housing 46 may be the same as the heat transfer member 21, the heat insulating member 22, the flexible member 24, the inner housing 25, and the outer housing 26, respectively.

Fifth Example

Figure 10:
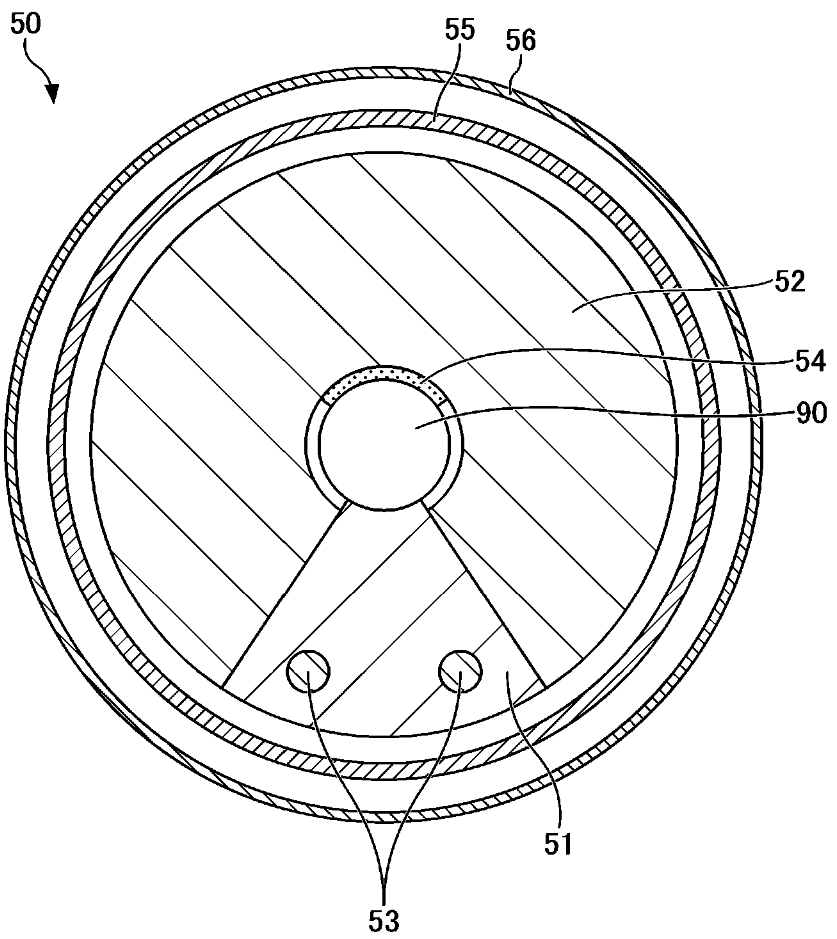
FIG. 10 is a cross-sectional view illustrating a line heater according to a fifth example of the embodiment.

A line heater 50 according to a fifth example of the embodiment will be described with reference to FIG. 10. FIG. 10 is a cross-sectional view illustrating the line heater 50 according to the fifth example of the embodiment. FIG. 10 is a view illustrating a cross section orthogonal to the central axis direction of a pipe 90.

The line heater 50 includes a heat transfer member 51, a heat insulating member 52, heaters 53, a flexible member 54, an inner housing 55, and an outer housing 56.

The line heater 50 differs from the line heater 20 in that two heaters 53 are embedded in the heat transfer member 51 and is in contact with the heat transfer member 51. The heat transfer member 51, the heat insulating member 52, the flexible member 54, the inner housing 55, and the outer housing 56 may be the same as the heat transfer member 21, the heat insulating member 22, the flexible member 24, the inner housing 25, and the outer housing 26, respectively.

Sixth Example

Figure 11:
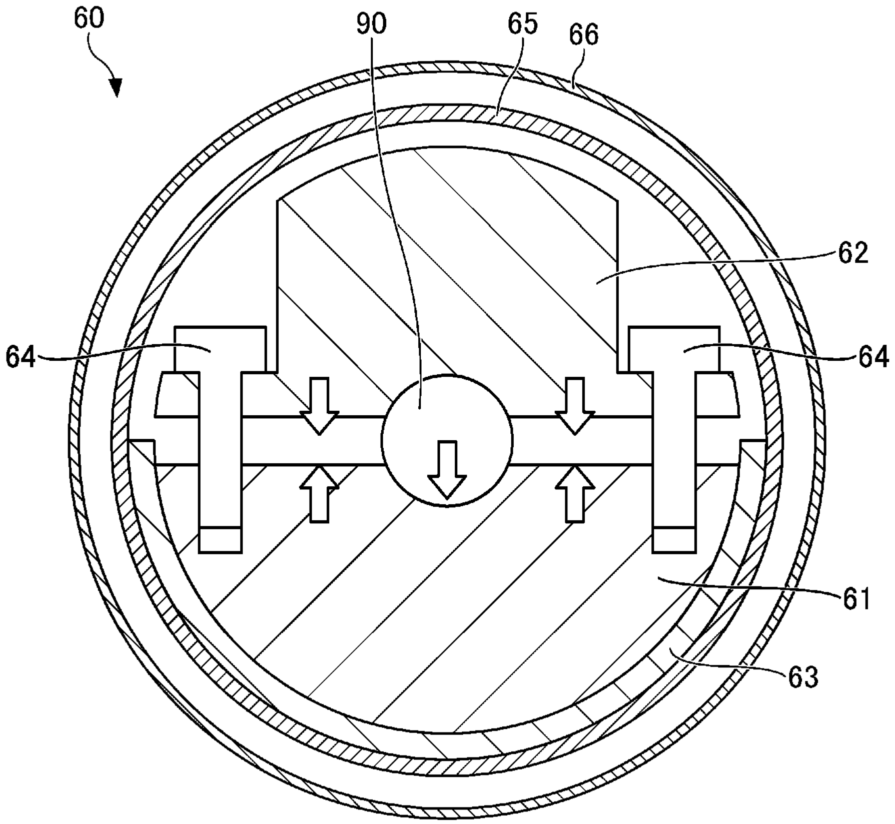
FIG. 11 is a cross-sectional view illustrating a line heater according to a sixth example of the embodiment.

A line heater 60 according to a sixth example of the embodiment will be described with reference to FIG. 11. FIG. 11 is a cross-sectional view illustrating the line heater 60 according to the sixth example of the embodiment. FIG. 11 is a view illustrating a cross section orthogonal to the central axis direction of a pipe 90.

The line heater 60 includes a heat transfer member 61, a heat insulating member 62, heaters 63, screws 64, an inner housing 65, and an outer housing 66.

The line heater 60 differs from the line heater 20 in that the screws 64 are provided instead of the flexible member 24. The screws 64 connect the heat transfer member 61 and the heat insulating member 62. The screws 64 move the heat transfer member 61 and the heat insulating member 62 toward each other and press the pipe 90 against the heat transfer member 61. As a result, the adhesion between the heat transfer member 61 and the pipe 90 is improved. Therefore, thermal resistance generated in the contact surfaces between the heat transfer member 61 and the pipe 90 may be reduced. The screws 64 are an example of connecting members.

The heat transfer member 61, the heat insulating member 62, the heater 63, the inner housing 65, and the outer housing 66 may be the same as the heat transfer member 21, the heat insulating member 22, the heater 23, the inner housing 25, and the outer housing 26, respectively.

Seventh Example

Figure 12:
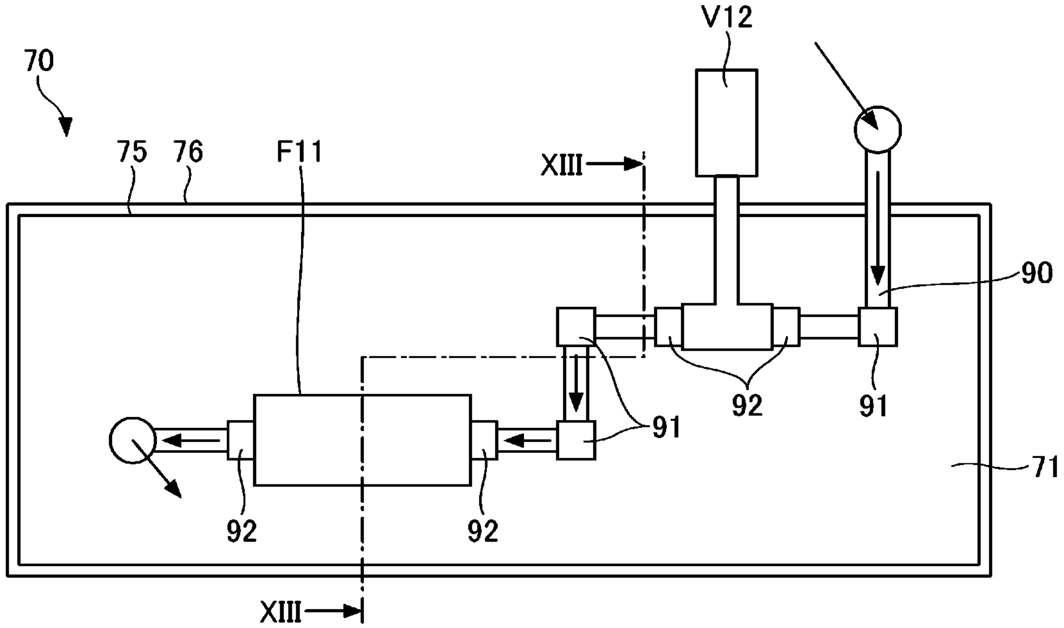
FIG. 12 is a cross-sectional view illustrating a line heater according to a seventh example of the embodiment.
Figure 13:
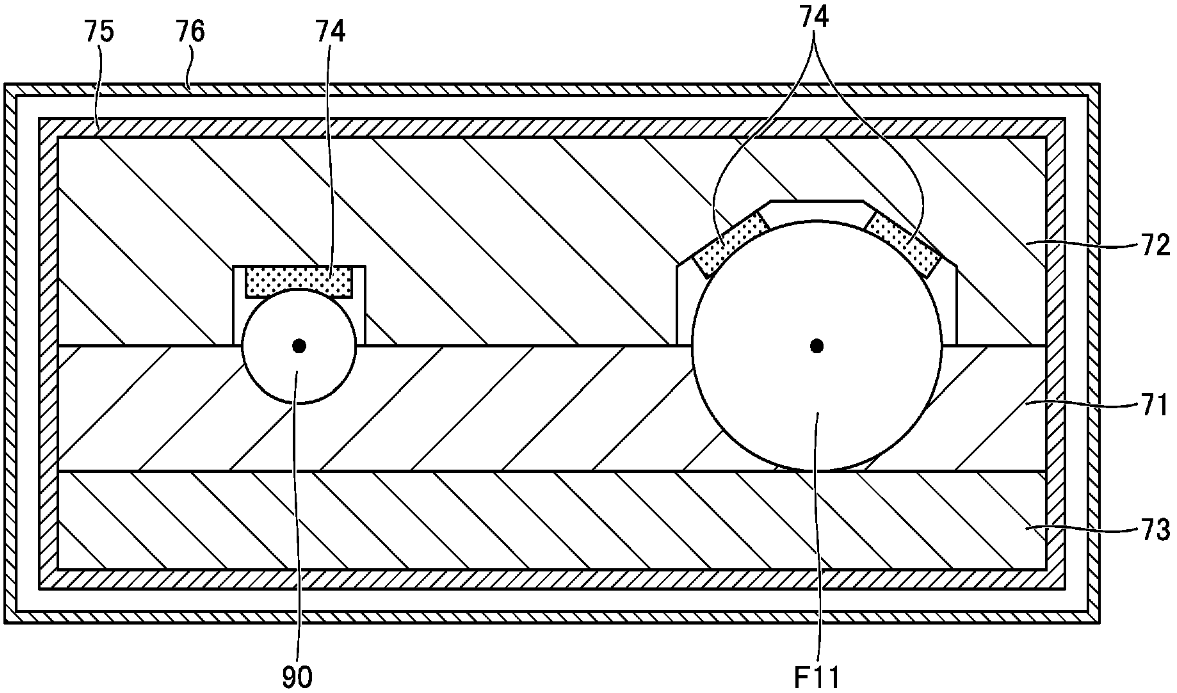
FIG. 13 is a cross-sectional view illustrating the line heater according to the seventh example of the embodiment.

A line heater 70 according to a seventh example of the embodiment will be described with reference to FIGS. 12 and 13. FIG. 12 is a cross-sectional view illustrating the line heater 70 according to the seventh example of the embodiment. Arrows in FIG. 12 indicate a fluid flow direction. FIG. 13 is a view corresponding to a cross section taken along line XIII-XIII in FIG. 12.

The line heater 70 is provided, for example, in a portion where a pipe 90 forming the supply channel L11 and an opening/closing valve V12 and a filter F11 provided in the supply channel L11 are arranged. The line heater 70 includes a heat transfer member 71, a heat insulating member 72, a heater 73, flexible members 74, an inner housing 75, and an outer housing 76.

The line heater 70 differs from the line heater 10 in that the heat transfer member 71 and the heat insulating member 72 are provided such that pipes 90, pipe joints 91 and 92, an opening/closing valve V12, and a filter F11 are interposed therebetween.

The heat transfer member 71 and the heat insulating member 72 are provided to face each other such that the pipes 90, the pipe joints 91 and 92, the opening/closing valve V12, and the filter F11 are interposed therebetween. In this case, since the pipes 90, the pipe joints 91 and 92, the opening/closing valve V12, and the filter F11 may be collectively heated, a temperature fluctuation of each portion may be suppressed. For example, a temperature fluctuation due to heat radiation from the pipe joints 91 and 92, the opening/closing valve V12, and the filter F11 may be suppressed. The pipe joints 91 are joints that connect the pipes 90 to each other. The pipe joints 92 are joints that connect the pipes 90 and fluid control devices (the opening/closing valve V12 and the filter F11). In a cross section orthogonal to a fluid flow direction (the cross section illustrated in FIG. 13), a straight line passing through the center of the pipe 90 and the center of the filter F11 may be parallel to a boundary line between the heat transfer member 71 and the heater 73. In this case, a distance from the heater 73 to the pipes 90 is equal to a distance from the heater 73 to the pipe 90 connected to the inlet/outlet of the filter F11. Therefore, the pipes 90 may be evenly heated.

The flexible members 74 are provided between the pipes 90 and the heat insulating member 72. The flexible members 74 are provided between the filter F11 and the heat insulating member 72. The flexible members 74 press the pipes 90 and the filters F11 against the heat transfer member 71 in a state in which the heat transfer member 71 and the heat insulating member 72 are in contact with each other with the pipes 90 and the filter F11 interposed therebetween. In this case, the adhesion between the heat transfer member 71 and the pipes 90 and the filter F11 is improved. Therefore, heat resistance generated in the contact surfaces between the heat transfer member 71 and the pipes 90 and the filter F11 may be reduced. The flexible members 74 are made of, for example, the same material as the flexible members 14.

The inner housing 75 and the outer housing 76 may be the same as the inner housing 15 and the outer housing 16, respectively.

In addition, in the seventh example of the embodiment, the opening/closing valve V12 and the filter F11 have been exemplified as fluid control devices, but are not limited thereto. For example, the fluid control devices may include the pressure sensors P11 and P12, the temperature sensors T11 and T12, the flow meter FM11, the back pressure valve BV11, and the opening/closing valve V13.

[Temperature Sensor]

Figure 14:
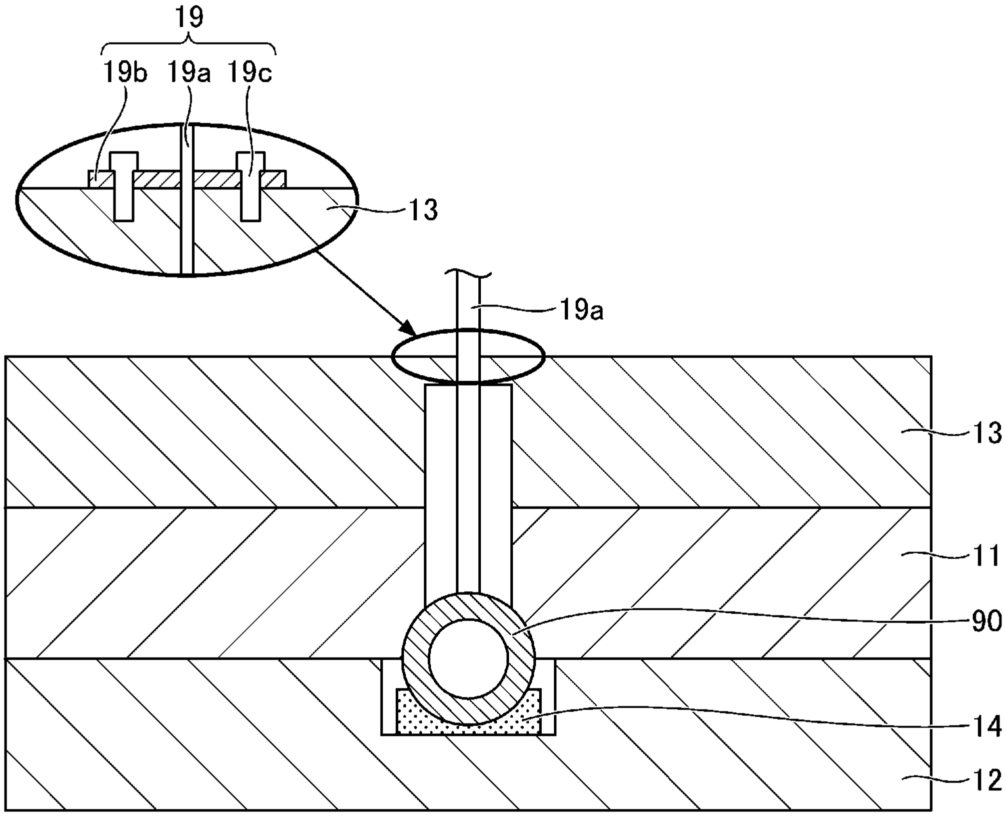
FIG. 14 is a cross-sectional view illustrating an example of a temperature measurer.
Figure 15:
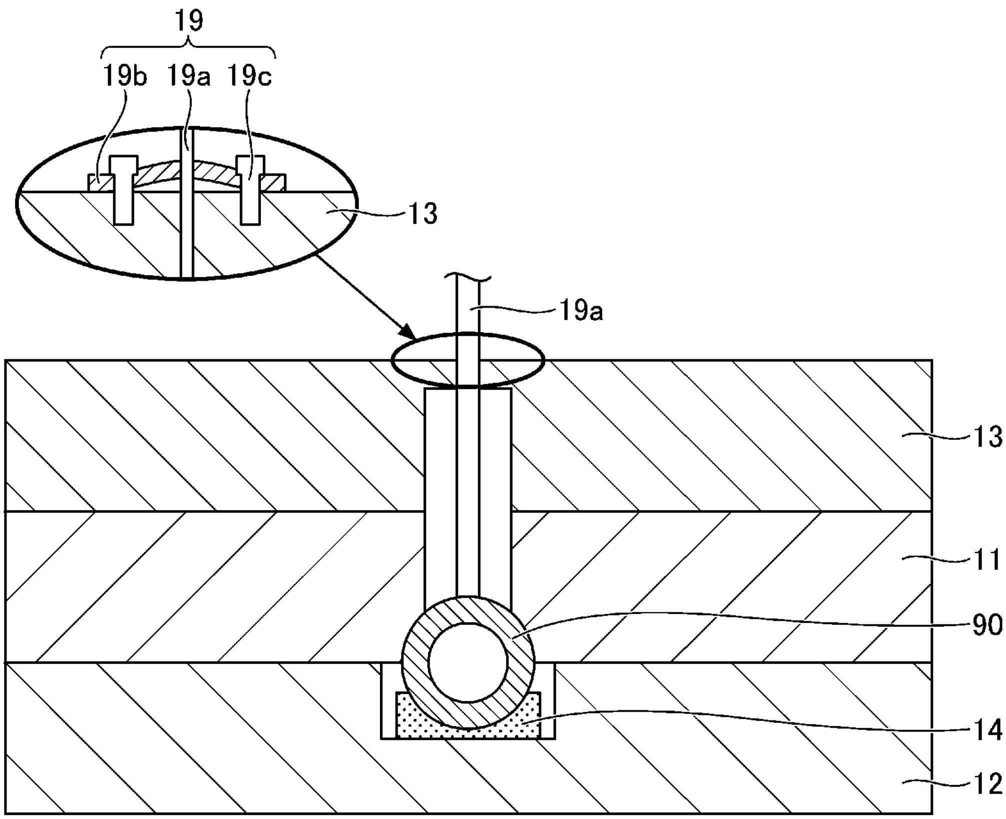
FIG. 15 is a cross-sectional view illustrating an example of the temperature measurer.
Figure 16:
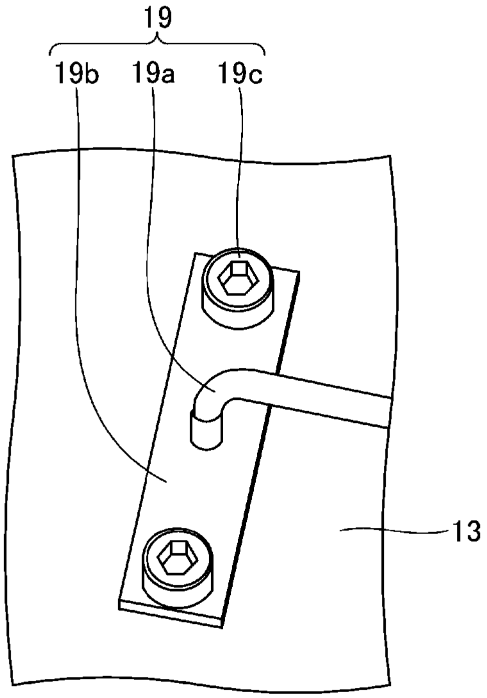
FIG. 16 is a perspective view illustrating an example of the temperature measurer.
Figure 17:
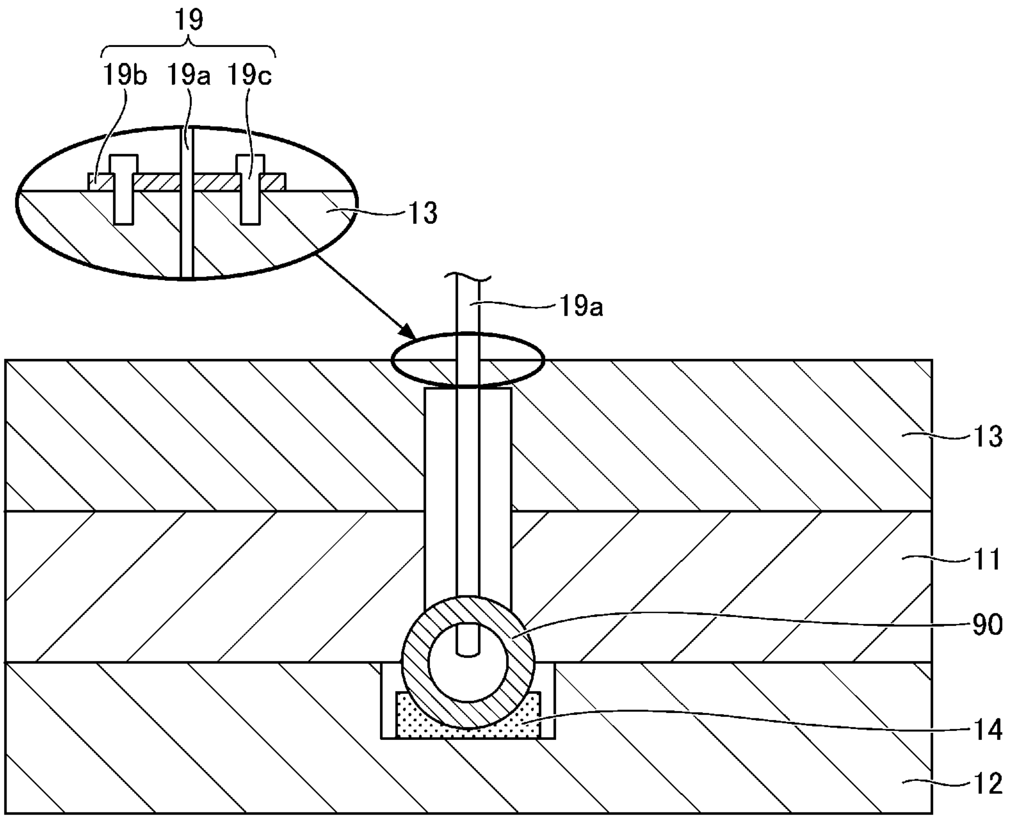
FIG. 17 is a cross-sectional view illustrating another example of the temperature measurer.

The temperature measurer 19 included in the line heater 10 will be described with reference to FIGS. 14 to 17. FIGS. 14 and 15 are cross-sectional views illustrating examples of the temperature measurer 19. FIG. 16 is a perspective view illustrating an example of the temperature measurer 19. FIG. 17 is a cross-sectional view illustrating another example of the temperature measurer 19.

The temperature measurer 19 includes a temperature measuring element 19*a*, a spring plate 19*b*, and screws 19*c*.

As illustrated in FIG. 14, the temperature measuring element 19*a* penetrates the heater 13 and the heat transfer member 11 so that the tip thereof comes into contact with the outer wall surface of a pipe 90. As illustrated in FIG. 17, the temperature measuring element 19*a* may penetrate the heater 13, the heat transfer member 11, and the wall of the pipe 90 so that the tip thereof is positioned inside the pipe 90. The temperature measuring element 19*a* detects a temperature at the tip thereof. The temperature measurer 19 transmits a value detected by the temperature measuring element 19*a* to the controller 5. The controller 5 controls the heater 13 based on, for example, the value detected by the temperature measuring element 19*a*.

The spring plate 19*b* is fixed to the heater 13 with the screws 19*c*. The spring plate 19*b* presses the tip of the temperature measuring element 19*a* to be brought into contact with the wall of the pipe 90. When a force acts on the temperature measuring element 19*a* in a direction away from the pipe 90, the spring plate 19*b* is deformed into a convex shape as illustrated in FIG. 15 to absorb the displacement of the temperature measuring element 19*a*.

[Processor]

Figure 18:
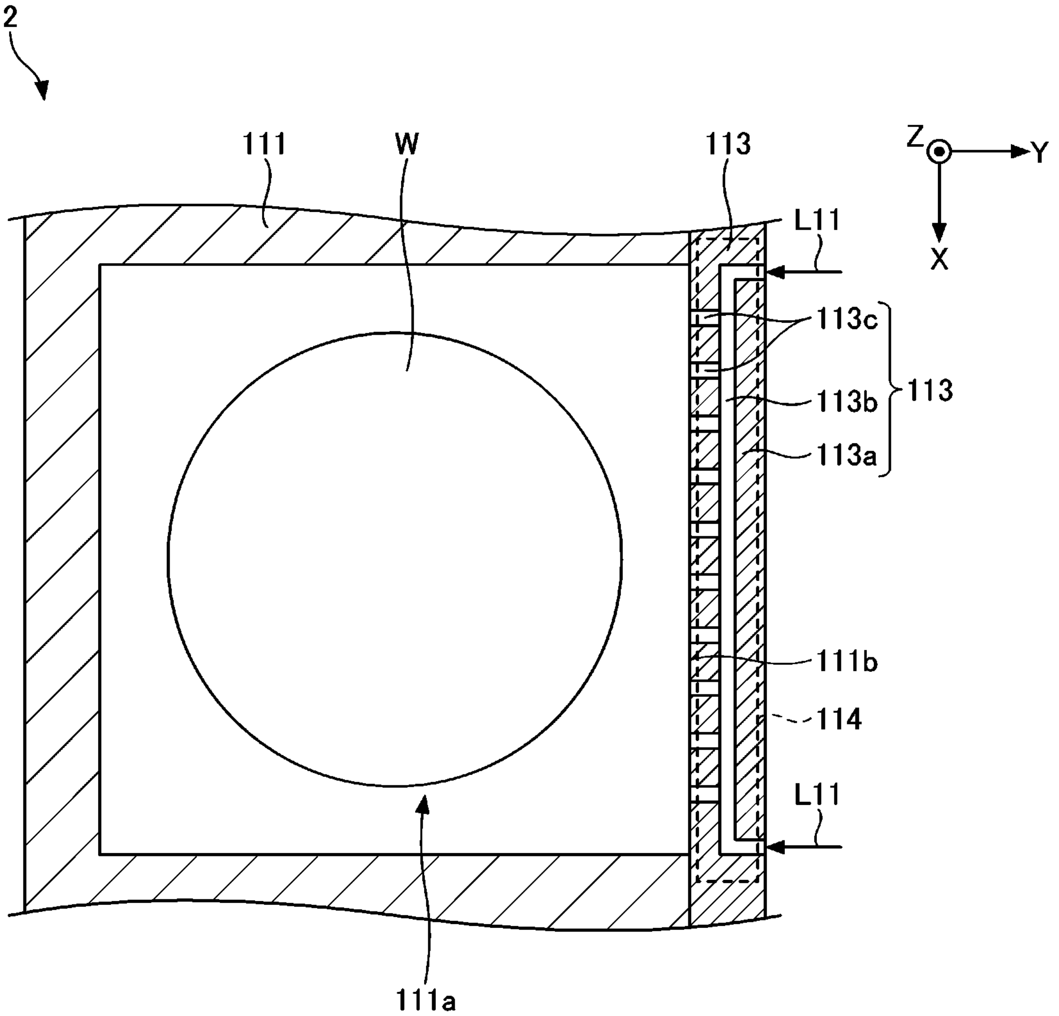
FIG. 18 is a horizontal cross-sectional view illustrating an example of a processor.
Figure 19:
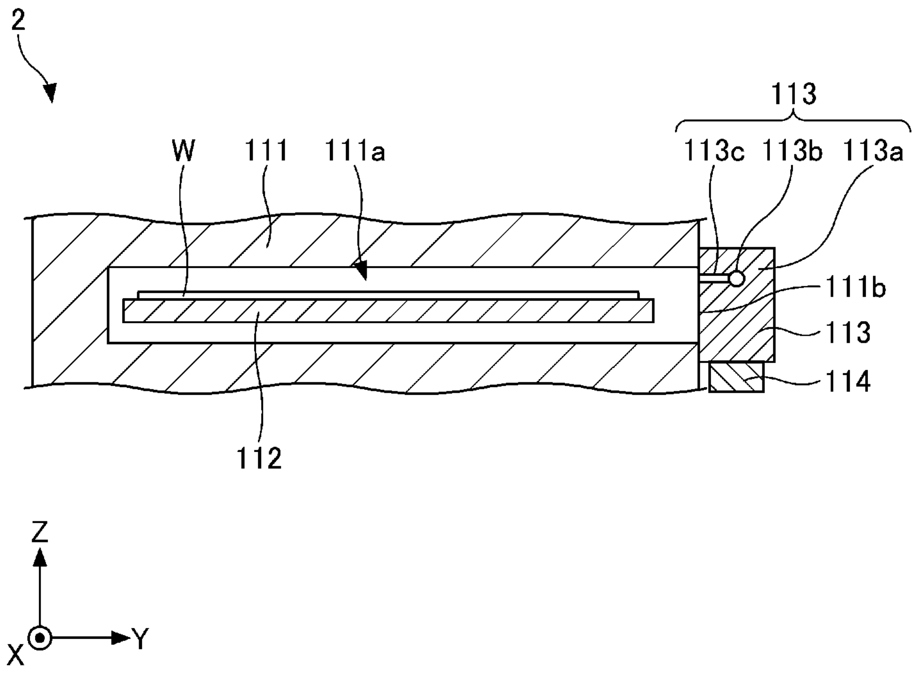
FIG. 19 is a horizontal cross-sectional view illustrating an example of the processor.

A configuration example of the processor 2 will be described with reference to FIGS. 18 and 19. FIG. 18 is a horizontal cross-sectional view illustrating an example of the processor 2. FIG. 19 is a vertical cross-sectional view illustrating an example of the processor 2.

The processor 2 includes a processing container 111, a holding plate 112, a fluid supply nozzle 113, and a heater 114.

The processing container 111 is a container in which a processing space 111*a* capable of accommodating, for example, a substrate W having a diameter of 300 mm, is formed. The processing space 111*a* has, for example, a rectangular parallelepiped shape. A rectangular opening 111*b* is formed on a positive side of the processing container 111 in the Y-axis direction.

The holding plate 112 is provided inside the processing container 111. The holding plate 112 holds the substrate W horizontally. The holding plate 112 is fixed to, for example, the processing container 111.

The fluid supply nozzle 113 is provided on a positive side of the processing container 111 in the Y-axis direction. The fluid supply nozzle 113 includes a block body 113*a*, a fluid channel 113*b*, and ejection ports 113*c*.

The block body 113*a* has a rectangular parallelepiped shape extending along the X-axis direction. The block body 113*a* blocks the opening 111*b*.

The fluid channel 113*b* is provided inside the block body 113*a*. The fluid channel 113*b* may be, for example, an elongated hole formed inside the block body 113*a*. The fluid from the fluid source S11 is introduced into the fluid channel 113*b* via the supply channel L11. The fluid channel 113*b* is provided with, for example, two inlets into which the fluid is introduced.

The ejection ports 113*c* are provided inside the block body 113*a*. The ejection ports 113*c* may be, for example, elongated holes formed inside the block body 113*a*. As illustrated in FIG. 18, a plurality of ejection ports 113*c* are provided at intervals in the X-axis direction. One end portion of each ejection port 113*c* communicates with the fluid channel 113*b*, and the other end portion communicates with the processing space 111*a*. The plurality of ejection ports 113*c* form a curtain-like airflow above the substrate W. While passing over the substrate W, the fluid replaces a fluid for preventing drying of the front surface of the substrate W, and is discharged from the interior of the processing chamber 111 by a discharge mechanism (not illustrated).

The heater 114 is fixed to a bottom surface of the fluid supply nozzle 113 and is in contact with the bottom surface of the fluid supply nozzle 113. The heater 114 may be fixed to a top surface of the fluid supply nozzle 113 and may be in contact with the top surface of the fluid supply nozzle 113. The heater 114 extends along the X-axis direction. The heater 114 heats the fluid supply nozzle 113. The heater 114 suppresses the temperature drop when the fluid heated to the set temperature by the heating mechanism HE11 flows through the fluid channel 113*b* and each ejection port 113*c*.

As a result, the temperature fluctuation of the fluid supplied into the processing container 111 from each ejection port 113*c* may be reduced. Therefore, the in-plane uniformity of processing is improved. The heater 114 is provided to supply the fluid heated to the set temperature by the heating mechanism HE11 into the processing container 111 in an environment having the same temperature as the set temperature. The heater 114 is, for example, a block body in which a heating element is embedded. The heater 114 is an example of a third fluid heating device.

The heater 114 is provided to overlap, for example, the entire portion of the fluid channel 113*b* extending along the X-axis direction when viewed from on the positive side in the Z-axis direction. In this case, it is easy to suppress the temperature drop of the fluid flowing through the fluid channel 113*b*. The heater 114 may be provided, for example, to overlap at least some of all the ejection ports 113*c* when viewed from the positive side in the Z-axis direction.

Experimental Example

In Experimental Example 1, a temperature fluctuation of a fluid was evaluated when the substrate W was processed by using the line heaters 70 illustrated in FIGS. 12 and 13 as the line heaters LH11 and LH12 in the substrate processing apparatus 1 according to the embodiment.

Figure 20:
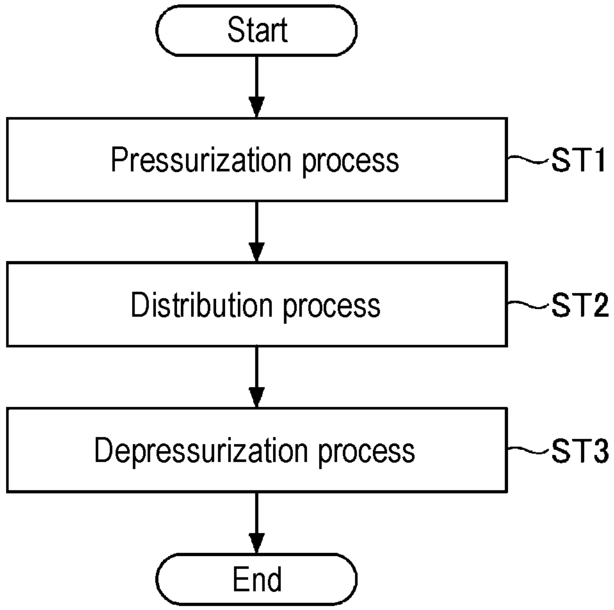
FIG. 20 is a view illustrating a processing flow for identifying a temperature fluctuation of a fluid.

FIG. 20 is a view illustrating a processing flow for identifying a temperature fluctuation of a fluid. In Experimental Example 1, in a state in which the substrate W is placed on the holding plate 112, a temperature fluctuation of a fluid was measured while executing a pressurization process ST1, a distribution process ST2, and a depressurization process ST3, which are illustrated in FIG. 20, in that order.

In the pressurization process ST1, by bringing the opening/closing valves V11 and V12 into the open state and the opening/closing valve V13 into the closed state, the fluid was supplied from the supply channel L11 into the processing container 111 and the interior of the processing container 111 was pressurized. The fluid is carbon dioxide. After the internal pressure of the processing container 111 reached a predetermined pressure, the pressurization process ST1 was terminated, and the distribution process ST2 was initiated. The predetermined pressure is a pressure at which the fluid is in a supercritical state.

In the distribution process ST2, by bringing the opening/closing valves V11, V12, and V13 into the open state, the fluid was supplied from the supply channel L11 into the processing container 111, the fluid is discharged from the discharge channel L12, and the internal pressure of the processing container 111 was maintained at a pressure higher than a critical pressure.

In the depressurization process ST3, by bringing the opening/closing valves V11 and V12 into the closed state and the opening/closing valve V13 into the open state, the fluid was discharged from the interior of the processing container 111, and the interior of the processing container 111 was depressurized.

In the pressurization process ST1, the distribution process ST2, and the depressurization process ST3, and the depressurizing process ST3, the heating mechanism HE11 and the line heaters LH11 and LH12 were controlled such that the temperature of the fluid immediately in front of and behind the processing container 111 reached a target temperature.

Comparative Example 1 was carried out for comparison with Experimental Example 1. In Comparative Example 1, in the substrate processing apparatus 1, as line heaters LH11 and LH12, a line heaters was provided only around a pipe 90, and a temperature fluctuation of a fluid was evaluated when a substrate W was processed in the same manner as in Experimental Example 1. The line heater of Comparative Example 1 has a structure in which the pipe 90 is clamped with an aluminum block from the outer periphery thereof and a heater, which is covered with a heat-resistant cloth, is wound from the outer periphery of the aluminum block.

Figure 21:
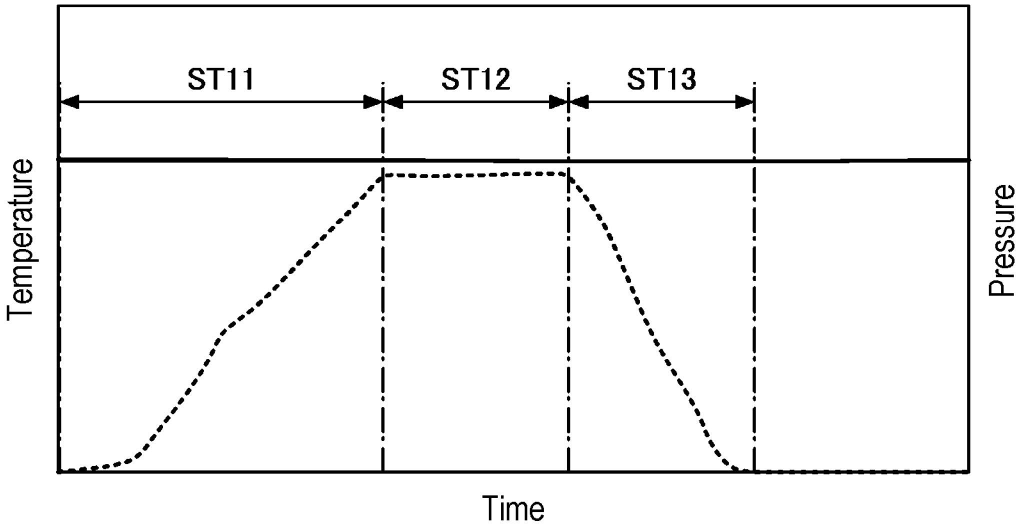
FIG. 21 is a diagram illustrating a temperature fluctuation of a fluid in Experimental Example 1.
Figure 22:
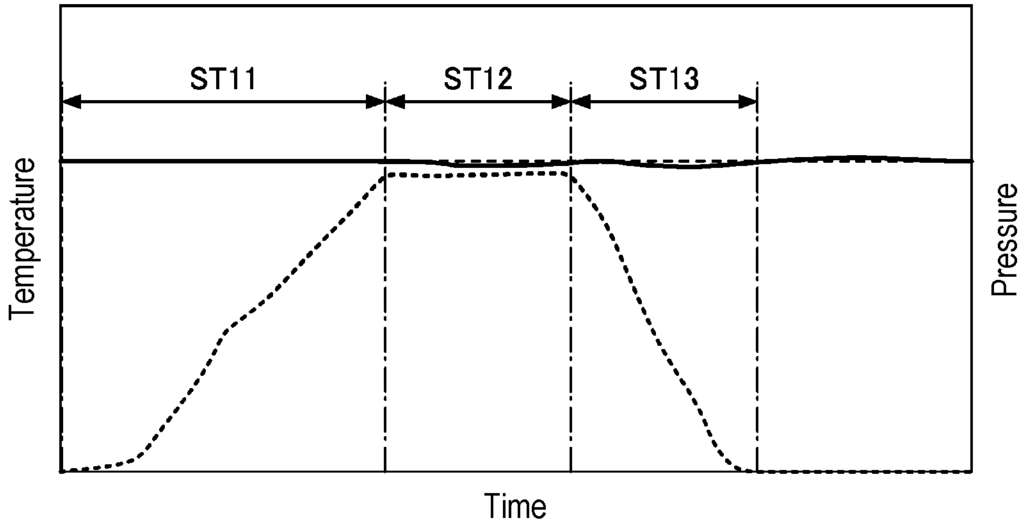
FIG. 22 is a diagram illustrating a temperature fluctuation of the fluid in Experimental Example 1.

FIGS. 21 and 22 are diagrams illustrating temperature fluctuations of a fluid in Experimental Example 1. FIG. 21 illustrates the temperature fluctuation of the fluid immediately in front of the processing container 111. FIG. 22 illustrates the temperature fluctuation of the fluid immediately behind the processing container 111. In FIG. 21, the horizontal axis represents time, the left vertical axis represents temperature detected by the temperature sensor T11, and the right vertical axis represents pressure detected by the pressure sensor P11. In FIG. 22, the horizontal axis represents time, the left vertical axis represents temperature detected by the temperature sensor T12, and the right vertical axis represents pressure detected by the pressure sensor P12. In FIGS. 21 and 22, the solid line indicates the detected temperature, the dashed line indicates the target temperature, and the dotted line indicates the detected pressure.

Figure 23:
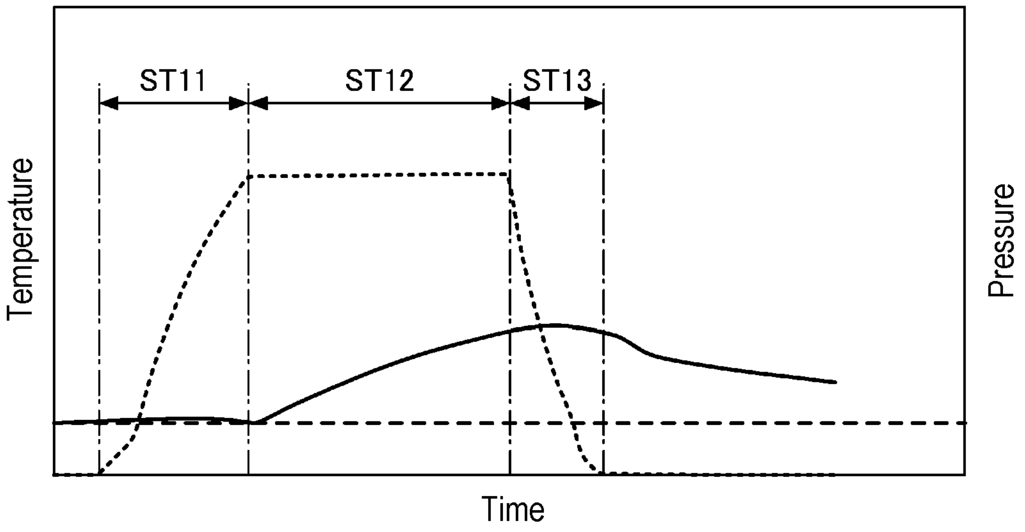
FIG. 23 is a diagram illustrating a temperature fluctuation of a fluid in Comparative Example 1.
Figure 24:
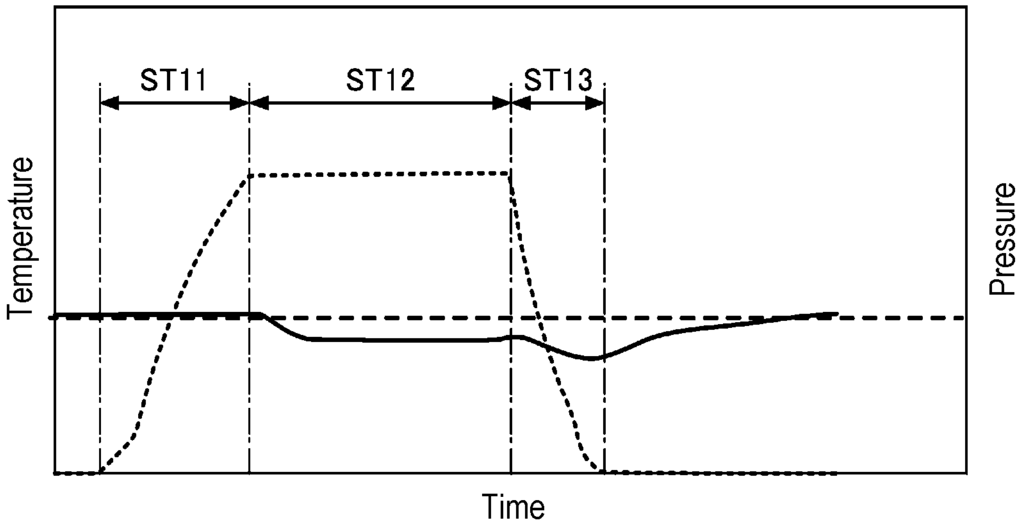
FIG. 24 is a diagram illustrating a temperature fluctuation of the fluid in Comparative Example 1.

FIGS. 23 and 24 are diagrams illustrating temperature fluctuations of a fluid in Comparative Example 1. FIG. 23 illustrates the temperature fluctuation of the fluid immediately in front of the processing container 111. FIG. 24 illustrates the temperature fluctuation of the fluid immediately behind the processing container 111. In FIG. 23, the horizontal axis represents time, the left vertical axis represents temperature detected by the temperature sensor T11, and the right vertical axis represents pressure detected by the pressure sensor P11. In FIG. 24, the horizontal axis represents time, the left vertical axis represents temperature detected by the temperature sensor T12, and the right vertical axis represents pressure detected by the pressure sensor P12. In FIGS. 23 and 24, the solid line indicates the detected temperature, the dashed line indicates the target temperature, and the dotted line indicates the detected pressure.

As illustrated in FIGS. 21 and 22, in Experimental Example 1, it may be seen that the temperature of the fluid immediately in front of and behind the processing container 111 is substantially the same as the target temperature in the pressurization process ST1, the distribution process ST2, and the depressurization process ST3, and there is almost no temperature fluctuation.

On the other hand, as illustrated in FIG. 23, in Comparative Example 1, it may be seen that the temperature of the fluid immediately in front of the processing container 111 is higher than the target temperature in the distribution process ST2 and the depressurization process ST3. In addition, as illustrated in FIG. 24, in Comparative Example 1, it may be seen that the temperature of the fluid immediately behind the processing container 111 is lower than the target temperature in the distribution process ST2 and the depressurization process ST3.

From the above results, it was shown that, by using the line heater 70 illustrated in FIGS. 12 and 13 as the line heaters LH11 and LH12, the temperature of the fluid supplied into the processing container 111 and the temperature of the fluid discharged from the processing container 111 may be controlled with high accuracy. That is, it was shown that a temperature fluctuation of a fluid may be reduced.

Figure 25:
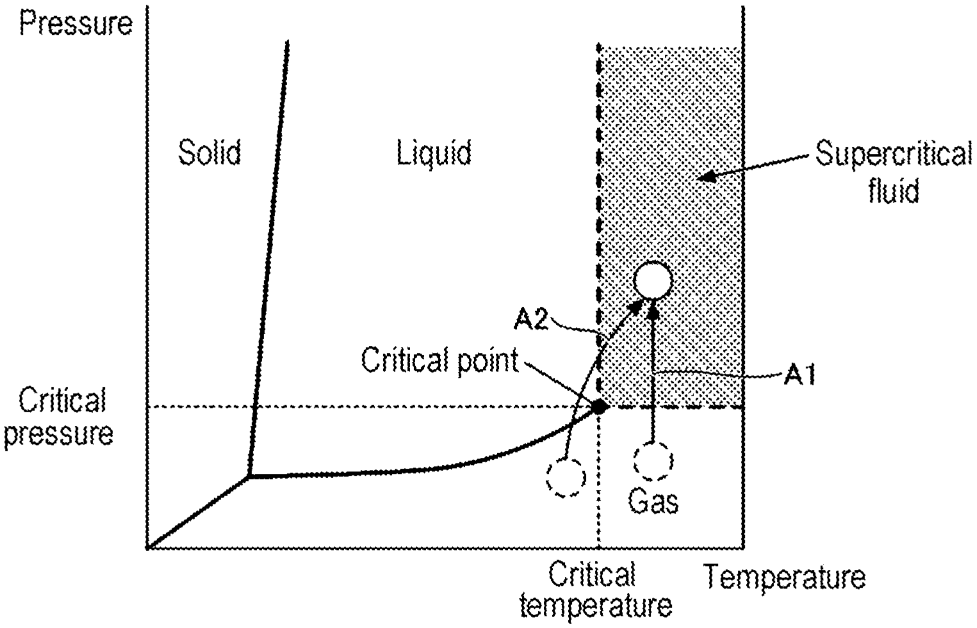
FIG. 25 is a state diagram of a substance.

In addition, since a fluid is supplied into the processing container 111 in the state in which there is almost no temperature fluctuation, a fluid in a supercritical state (supercritical fluid) may be generated from a fluid in a gaseous state by controlling only pressure without considering a change in temperature (see arrow A1 in FIG. 25). Therefore, control is easy. In contrast, when a fluid is supplied into the processing container 111 in the state where the temperature fluctuates or when a supercritical fluid is generated from a fluid in a gaseous state, it is necessary to control the pressure in consideration of a temperature change (see arrow A2 in FIG. 25).

According to the present disclosure, it is possible to reduce a temperature fluctuation of a processing fluid.

It is to be considered that the embodiments disclosed herein are exemplary in all respects and not restrictive. Various types of omissions, replacements, and changes may be made to the above-described embodiment without departing from the scope and spirit of the appended claims.

What is claimed is:

1. A substrate processing apparatus that dries a liquid adhering to a substrate by using a processing fluid in a supercritical state, comprising:

a processing container in which the substrate is accommodated;

a plurality of pipes configured to allow the processing fluid to flow to and from the processing container;

a first fluid heating device configured to heat a first pipe among the plurality of pipes that supplies the processing fluid to an interior of the processing container; and a second fluid heating device configured to heat a second pipe among the plurality of pipes that discharges the processing fluid from the interior of the processing container, wherein at least one of the first fluid heating device and the second fluid heating device comprises:

a heat transfer member that is in contact with at least one of the first pipe and the second pipe;

a heat insulating member provided such that the at least one of the first pipe and the second pipe is interposed between the heat insulating member and the heat transfer member;

a heater that is in contact with the heat transfer member;

an inner housing extending along a central axis direction of the at least one of the first pipe and the second pipe to cover the at least one of the first pipe and the second pipe, the heat transfer member, the heat insulating member, and the heater; and an outer housing provided outside the inner housing with a gap from the inner housing.

2. The substrate processing apparatus of claim 1, wherein the at least one of the first fluid heating device and the second fluid heating device comprises:

a flexible member disposed between the at least one of the first pipe and the second pipe and the heat insulating member.

3. The substrate processing apparatus of claim 1, wherein the at least one of the first fluid heating device and the second fluid heating device comprises:

a connecting member connecting the heat transfer member and the heat insulating member to each other.

4. The substrate processing apparatus of claim 1, further comprising:

a pipe joint connected to the at least one of the first pipe and the second pipe, wherein the heat transfer member and the heat insulating member are provided such that the pipe joint is interposed between the heat transfer member and the heat insulating member.

5. The substrate processing apparatus of claim 1, further comprising:

a fluid control device connected to the at least one of the first pipe and the second pipe, wherein the heat transfer member and the heat insulating member are provided such that the fluid control device is interposed between the heat transfer member and the heat insulating member.

6. The substrate processing apparatus of claim 5, wherein, in a cross section orthogonal to a flow direction of the processing fluid, a straight line passing through a center of the at least one of the first pipe and the second pipe and a center of the fluid control device is parallel to a boundary line between the heater and the heat transfer member.

7. The substrate processing apparatus of claim 5, wherein the fluid control device includes at least one of a filter, a valve, a temperature sensor, a pressure sensor, a flow meter, and an orifice.

8. The substrate processing apparatus of claim 1, wherein the heat transfer member and the heat insulating member are provided such that the plurality of pipes are interposed between the heat transfer member and the heat insulating member.

9. The substrate processing apparatus of claim 8, wherein, in a cross section orthogonal to a flow direction of the processing fluid, a straight line passing through centers of the plurality of pipes is parallel to a boundary line between the heater and the heat transfer member.

10. The substrate processing apparatus of claim 1, wherein the heat transfer member and the heat insulating member are made of a metal.

11. The substrate processing apparatus of claim 1, wherein the at least one of the first fluid heating device and the second fluid heating device comprises:

a temperature measurer provided with a temperature measuring element; and a tip of the temperature measuring element is in contact with an outer wall surface of the at least one of the first pipe and the second pipe or is positioned inside the at least one of the first pipe and the second pipe.

12. The substrate processing apparatus of claim 11, further comprising:

a controller configured to control a temperature of the heater based on a value detected by the temperature measurer.

13. The substrate processing apparatus of claim 12, wherein the processing fluid is carbon dioxide.

14. The substrate processing apparatus of claim 1, further comprising:

a fluid supply nozzle connected to the processing container to supply the processing fluid to the interior of the processing container; and a third fluid heating device that is in contact with the fluid supply nozzle to heat the fluid supply nozzle.

15. The substrate processing apparatus of claim 14, wherein the processing fluid is carbon dioxide.

16. The substrate processing apparatus of claim 1, wherein the processing fluid is carbon dioxide.

17. A fluid heating device that heats a processing fluid in a supercritical state flowing inside a pipe, comprising:

a heat transfer member that is in contact with the pipe;

a heat insulating member provided such that the pipe is interposed between the heat insulating member and the heat transfer member;

a heater that is in contact with the heat transfer member;

an inner housing extending along a central axis direction of the pipe to cover the pipe, the heat transfer member, the heat insulating member, and the heater; and an outer housing provided outside the inner housing with a gap from the inner housing.

* * * * *